United States Patent [19]

Carnall, Jr. et al.

[11] Patent Number: 5,270,491
[45] Date of Patent: Dec. 14, 1993

[54] HERMETICALLY SEALED MICROELECTRONIC PACKAGE

[75] Inventors: Edward Carnall, Jr., Rochester; Edward J. Ozimek, Penfield, both of N.Y.

[73] Assignee: Eastman Kodak Company, Rochester, N.Y.

[21] Appl. No.: 594,789

[22] Filed: Oct. 9, 1990

[51] Int. Cl.⁵ .............................. H01L 23/02
[52] U.S. Cl. ........................ 174/52.4; 257/678; 361/730; 174/50.62
[58] Field of Search ............. 174/50.61, 50.62, 50.63, 174/52.4; 356/74; 420/526, 527, 590; 257/678, 687, 701, 704, 703; 361/392, 394, 399, 415

[56] References Cited

U.S. PATENT DOCUMENTS

| | | | |
|---|---|---|---|
| 4,303,934 | 12/1981 | Stitt | 174/52.4 |
| 4,435,611 | 3/1984 | Ohsawa et al. | 174/68.5 |
| 4,451,540 | 5/1984 | Baird et al. | 174/52.4 |
| 4,626,960 | 12/1986 | Hamano et al. | 174/52.4 |
| 4,659,384 | 4/1987 | Daigo et al. | 106/35 |
| 4,664,629 | 5/1987 | Chodkowski | 420/527 |
| 4,694,185 | 9/1987 | Weiss | 250/578 |
| 4,727,221 | 2/1988 | Saitou et al. | 174/52.4 |
| 4,754,900 | 7/1988 | MacKay | 222/590 |
| 4,859,806 | 8/1989 | Smith | 174/68.5 |
| 4,895,291 | 1/1990 | Ozimek et al. | 228/121 |
| 4,931,854 | 6/1990 | Yonemasu et al. | 174/52.4 |
| 5,043,139 | 8/1991 | Carnall, Jr. et al. | 420/526 |
| 5,053,195 | 10/1991 | MacKay | 420/590 |
| 5,061,442 | 10/1991 | Ozimek | 420/526 |

OTHER PUBLICATIONS

Abstract-C. A. MacKay, International Electronic Packaging Conf., San Diego, Calif., Sep. 11-13, 1989, published in the Conference Proceedings, pp. 1244-1259, Int. Electronic Packaging Society, 1989.

*Primary Examiner*—Leo P. Picard
*Assistant Examiner*—Bot Ledynh
*Attorney, Agent, or Firm*—Raymond L. Owens

[57] ABSTRACT

A hermetically sealed package for a microelectronic device, such as a solid-state image sensor, includes a ceramic housing defining a cavity in a major surface thereof and metal terminals extending through side edges thereof to the cavity. A microelectronic device is in the cavity and electrically connected to the terminals. A cover plate extends over the cavity and over a portion of the major surface around the cavity. An amalgam of a mixture of a liquid metal and a powdered metal is between the cover plate and the housing surface. The amalgam bonds the cover plate to the housing and forms a hermetical seal therebetween.

9 Claims, 1 Drawing Sheet

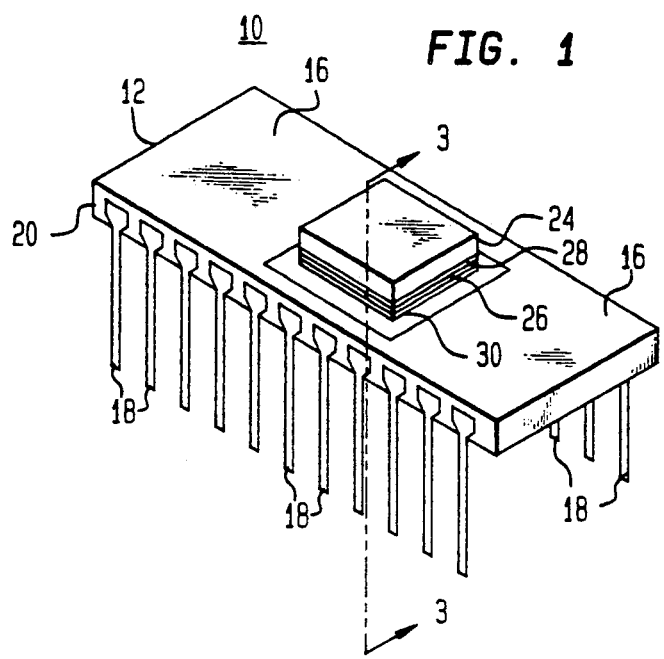
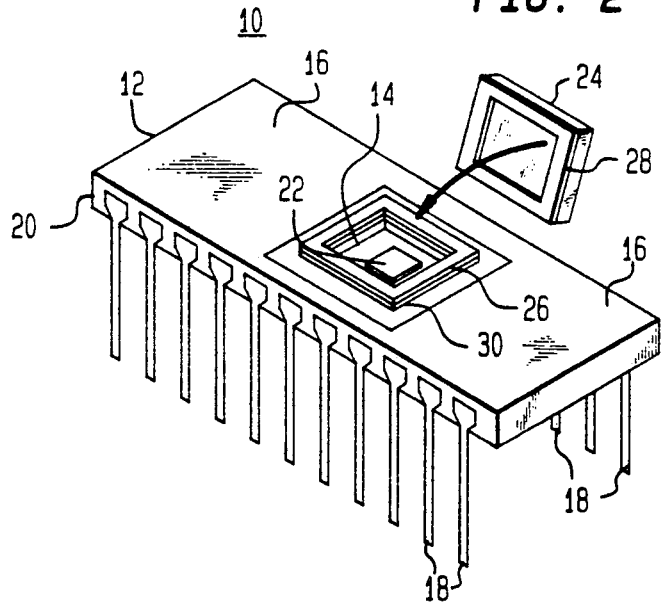
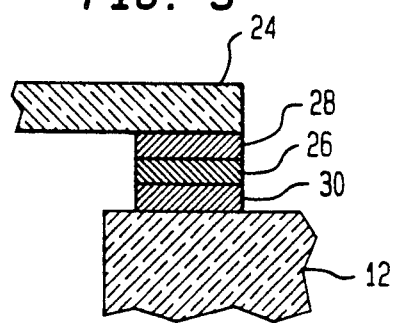

HERMETICALLY SEALED MICROELECTRONIC PACKAGE

FIELD OF THE INVENTION

The present invention relates to a hermetic seal for a microelectronic package and a method of making the same, and, more particularly, to a microelectronic package using an amalgam to hermetically seal the package and a method of making the package.

BACKGROUND OF THE INVENTION

Microelectronic devices, such as various types of integrated circuits, are generally hermetically sealed in a package to protect the microelectronic device from being damaged and from the ambient. One type of package used comprises a ceramic housing which has a cavity in a surface thereof in which the microelectronic device is mounted with a cover plate extending over the cavity and hermetically sealed to the housing. The cover may be a metal plate or a plate of an insulating material, such as glass or ceramic. The cover plate is generally sealed to the housing by a solder which adheres to the material of both the housing and the cover plate and which will withstand the operating temperature of the microelectronic device. Often, the housing and/or cover plate is provided with an adherent metal layer to which the solder will bond so as to provide the desired hermetic and mechanical bond between the housing and cover plate.

A problem with using a solder for sealing the cover plate to the housing arises from the high temperature required to melt the solder when bonding the cover plate to the housing. There are some microelectronic devices that cannot stand such high temperatures and which can be damaged during the bonding of the cover plate to the housing. For example, certain types of solid-state image sensors include an optical filter layer or a lenslet of a resin which will melt or degrade at the high temperatures required for melting solders. Therefore, it is desirable to have a sealing means for bonding a cover plate to a housing of a microelectronic package which can achieve the bond at low temperature which do not adversely affect the microelectronic device in the package. One such sealing means is described in U.S. Pat. No. 4,895,291 to E. J. Ozimek et al, issued Jan. 23, 1990, entitled "Method of Making a Hermetic Seal in a Solid-State Device". However, a probelm with the sealing means described in this patent is that it will melt at the same low temperature at which it is formed. Thus, if the microelectronic device is subjected to that low temperature the bond will be destroyed. Therefore, the sealing means not only must be capable of being formed at relatively low temperatures, and providing both a good machanical and hermetic seal between the cover plate and housing, but also must be capable of withstanding the operating temperature of the microelectronic device which can be higher than the temperature at which the bond is initially formed.

SUMMARY OF THE INVENTION

The present invention relates to the use of an amalgam for hermetically sealing the cover plate to the housing of a microelectronic package. The amalgam is a mixture of a liquid metal, such as mercury or gallium, and particles of another metal or metals. The amalgam can be set at relatively low temperatures to provide a good mechanical and hermetic seal between the cover plate and housing, and once set will withstand much higher temperatures.

More particularly, the present invention relates to a hermetically sealed package which comprises a housing defining a cavity in a portion of a surface thereof, and a cover plate extending over the cavity and a portion of the housing surface around the cavity. An amalgam of a mixture of a liquid metal and metal particles is placed between the cover plate and the surface of the housing and secures the cover plate to the housing and provides a hermetic seal therebetween. The cover plate is sealed to the housing by placing the amalgam between the cover plate and housing surface, scrubbing the cover plate onto the surface of the housing by relative movement therebetween to wet the amalgam to the cover plate and the housing, and then setting the amalgam to bond the cover plate to the housing.

The invention will be better understood from the following more detailed description taken with the accompanying drawings.

BRIEF DESCRIPTION OF DRAWINGS

FIG. 1 is a perspective view of a microelectronic package utilizing the present invention;

FIG. 2 is an exploded perspective view of the package with a cover thereof lifted off to expose a microelectronic device therein; and FIG. 3 is a sectional view taken along line 3—3 of FIG. 1.

It should be understood that the FIGs. of the drawing are not necessarily drawn to scale.

DETAILED DESCRIPTION

Referring to FIG. 1, there is shown a perspective view of a microelectronic device package 10 sealed in accordance with the present invention. FIG. 2 shows the same view as FIG. 1 but with a cover 24 of the package 10 lifted off to expose a microelectronic device 22 packaged therein. FIG. 3 shows a partial sectional view of a portion of FIG. 1 taken through dashed line 3—3. The package 10 comprises a substantially rectangular housing 12, which is generally of a ceramic material, such as alumina, metal terminals (pins, external contacts) 18 projecting from opposed side edges 20, the cover 24, a bonding and sealing means 26 and sealing pads 28 and 30. Although the sealing pads 28 and 30 are not essential, they can be used to facilitate the bonding of the cover 24 to the housing 12. As is shown in FIG. 2, the housing 12 defines a cavity 14 in a major surface 16 thereof in which the device 22 is placed. The arrow from cover 24 towards housing 12 indicates that cover 24 fits over cavity 14. The terminals 18 also have portions (not shown) which extend into the cavity 14 and facilitate electrical connection to portions (not shown) of the device 22. The sealing pad 30 is on surface 12 and surrounds the cavity 14. The bonding and sealing means 26 is over the sealing pad 30. The sealing pad 28 has essentially the same geometry shape as the bonding and sealing 26 and is on a surface of the cover 24.

Although the microelectronic device 22 can be of any type, such as an integrated circuit, the package 10 of the present invention is most useful for microelectronic devices which have features which cannot withstand high temperatures. For example, the package 10 is most useful for containing solid-state image sensors which have filter layers, lenslets or other features which cannot withstand high temperatures. One such solid-state image sensor is described in U.S. Pat. No. 4,694,185 issued Sep. 15, 1987 and assigned to the assignee of the present invention. The microelectronic device 22 has terminal pads, not shown, which are electrically connected to the portions of the terminals 18 which are within the cavity 14.

The cover 24 extends over the cavity 14 and the microelectronic device 22 and overlaps a portion of the housing surface 16 around the cavity 14. The cover 24 may be made of a metal or an insulating material, such as a ceramic. A package 10 for containing a solid-state imager preferably uses a cover of a transparent material, such as glass, quartz, sapphire, or other transparent ceramic material.

The bonding and sealing means 26 is provided between the peripheral portion of the cover 24 and the overlapped portion of the housing surface 16 to bond the cover 24 to the housing and provide a hermetic seat therebetween. In accordance with the present invention, the bonding and sealing means 26 is a narrow layer of an amalgam. The amalgam is a mixture of a liquid metal, such as mercury or gallium, and a metal powder or combination of metal powders. The metal powder or powders may be selected from a large number of metals well known for use in amalgams, such as copper, nickel, cobalt, gold, silver, tin, magnesium, antimony, manganese, chromium, titanium, molybdenum, aluminum, iron, and combinations of these metals. In general, the liquid metal is present in the amalgam in the amount by weight of 55% to 95%. Gallium is preferred as the liquid metal because mercury is toxic and can adversely affect the electrical characteristics of certain types of microelectronic devices. Copper and nickel are preferred as the powdered metal because they form amalgams having desirable properties, are relatively inexpensive and readily available. In an amalgam comprising liquid gallium and powdered copper and/or nickel, the gallium is preferably present in the amount of by weight of 65% to 70%.

Although the amalgams of the bonding and sealing means 26 wet and adhere well to most metals and ceramics, a good bond can be insured by providing sealing pads 28 and 30 on the surface of the cover 24 and the housing surface 16 respectively as shown in FIG. 3. The sealing pads 28 and 30 are preferably of the same metal as the metal powder or one of the metal powders in the amalgam of the bonding and sealing means 26. If the particular metal of the amalgam used for the sealing pads 28 and 30 does not adhere well to the material of the cover 24 or housing 14, a thin adherence layer, not shown, can be provided between the sealing pad 28 or 30 and the cover 14 and/or housing 12. The adherence layer would be of a metal which adheres well to the material of the cover 14 and/or housing 12 and to which the metal of the sealing pad 28 or 30 adheres.

To make a package 10, the amalgam is first made. This can be achieved by placing the liquid metal and the metal powder in the desired proportions in a container and mixing them together, preferably by a hammering process with a stainless steel pestle. However, for large scale operations, there are machines available which will automatically mix the ingredients of the amalgam. The housing 12 and cover plate 24 are cleaned with any well known cleaning technique. For example, a ceramic housing 12 may be cleaned by subjecting it to ultraviolet radiation with ozone to remove any organic material thereon, and a glass cover plate 24 may be cleaned with a chromerge solution, which is a concentrated sulfuric acid solution of potassium dichromate, followed by rinsing with deionized water. Preferably, the cover plate 24 is cleaned by repeatedly immersing it in the chromerge solution for a short period of time, 5 to 10 minutes, each followed by the rinsing. The repeated short period of cleaning have been found to be more satisfactory than immersing the cover plate 24 in the chromerge solution for a single long period of time. The microelectronic device 22 is then mounted in the cavity 14 in the housing 12 and electrically connected to the terminals 18. Preferably the housing 12 and cover plate 24 are heated in an oven for a short period of time, 2 to 3 minutes, at about 80° C. to facilitate the wetting of the amalgam to the housing 12 and cover plate 24. The amalgam is then placed along the surface 16 of the housing 12 around the recess 14. This can be achieved by means of any type of dispenser, such as the dispenser shown in U.S. Pat. No. 4,754,900 to C. A. MacKay, issued Jul. 5, 1988, entitled "Method of and Apparatus for Dispensing a Controlled Amount of a Liquid Metal". The cover plate 24 is then placed over the surface 16 of the housing 12 and in contact with the amalgam. A mechanical scrubbing of the cover plate 24 onto the housing 12 is carried out either by hand or by mechanical means. The scrubbing comprises moving the cover plate 24 with respect to the housing 12 in a plane parallel to the housing surface 16. This is carried out until good wetting of the amalgam to the cover plate 24 and housing surface 16 is achieved. Visual examination will show the continuity of the seal achieved by the amalgam. If a sealing pad of a metal contained in the amalgam is on the cover plate 24 or housing surface 16, the liquid metal in the amalgam will react with the metal of the sealing pad during the scrubbing step to form an amalgam with the sealing pad and provide a stronger bond between the amalgam and the sealing pad.

The cover plate 24 is then clamped to the housing 12 under a relatively light pressure, 1.5 to 2 pounds, and the assembly is placed in an oven at about 80° C. for a period of about 6 to 8 hours. This causes the amalgam to set and form a strong mechanical bond and hermetic seal between the cover plate 24 and housing 12. Although the amalgam can be allowed to set at room temperature, the time to achieve the setting will be much longer and may have a different final metallurgical phase. Although the amalgam is set at a relative low temperature, once set it can withstand much higher temperatures. The specific temperature which the amalgam can withstand depends on the compositions of the amalgam. For example, an amalgam of gallium, nickel and copper can withstand temperatures up to around 250° C.

A microelectronic package 10 was made with a housing of alumina and a transparent cover plate of a barium borosilicate glass. The housing contained a solid-state image sensor. A three gram charge of an amalgam was made using common dental equipment, an amalgamator and a capsule with a pestle. The amalgam comprised a mixture of by weight 65% liquid gallium, 30% copper powder and 5% nickel powder. The powders were of 325 mesh or finer. The nickel powder was one formed by a nickel-carbonyl gas reduction process since it had much less surface oxidation than those formed by other processes, such as an atomization spray process. The mixture was formed in the capsule using a hammering action of the stainless steel pestle.

Prior to mounting the image sensor in the housing, the housing and cover plate were cleaned. The housing was cleaned by subjecting it to ultraviolet radiation with ozone and the cover plate by three immersions in a chromerge solution each followed by rinsing with deionized water. After the image sensor was mounted in the housing, the housing and cover plate were placed in an oven at 80° C. for 2 to 3 minutes. A bead of the amalgam was then placed along the surface of the housing around the image sensor, and the heated cover plate was then carefully placed upon the heated housing and on the amalgam. The cover plate was then manually scrubbed onto the housing until good wetting of the amalgam with the cover plate and housing was achieved. The cover plate was clamped to the housing using a 1.5 to 2 pound clamping force. The assembly was placed in an air, inert gas or vacuum oven at 80° C. for a period of 6 to 8 hours. Upon removal of the assembly from the oven, it could be seen that the amalgam had set and a seal of good continuity was obtained. The package was then leak tested in accordance with standard testing procedure MIL 883-C with the parts having leak rates better than $10^{-7}$ cc/sec.

Thus, there is provided by the present invention a package for a microelectronic device using an amalgam to mechanically bond and hermetically seal a cover plate to a housing. The amalgam allows the seal to be obtained at relatively low temperatures so that it can be used with microelectronic devices, such as certain solid-state image sensors, which cannot withstand high temperatures. However, once the amalgam seal is set, it will withstand much higher temperatures than the setting temperature so that the seal will not be affected if subjected to higher temperatures during the operation of the microelectronic device.

It is to be appreciated and understood that the specific embodiments of the invention are merely illustrative of the general principles of the invention. Various modifications may be made consistent with the principles set forth. For example, although the package is most suitable for certain solid-state image sensors, it can be used for other types of microelectronic devices, particularly those which have features which will not withstand high temperatures. Also, the composition of the amalgam can vary as well as the ratio of the ingredients of the amalgam.

What is claimed is:

1. A hermetically sealed package comprising:
   a housing defining a cavity starting from a surface thereof;
   a solid state image sensor in the cavity in the housing;
   a transparent glass cover plate extending over the cavity and a portion of said surface around the cavity; and
   an amalgam of a mixture of a liquid metal and a metal powder between and bonded to the cover plate and said surface of the housing to secure the cover plate to the housing and form a hermetic seal therebetween, said amalgam being of a composition such that it is initially a liquid and can be set at a temperature sufficiently low that the solid state image sensor is not damaged, but which once set is capable of withstanding much higher temperatures without melting.

2. The hermetically sealed package of claim 1 in which the amalgam comprises a mixture of a liquid metal selected from the group consisting of mercury and gallium, and the powered metal is selected from the group consisting of copper, nickel, cobalt, gold, silver, tin, magnesium, antimony, manganese, chromium, titanium, molybdenum, aluminum, iron and combinations thereof.

3. The hermetically sealed package of claim 2 in which the liquid metal is present in the amount of 55% to 95% by weight.

4. The hermetically sealed package of claim 2 in which the amalgam is a mixture of liquid gallium and powdered nickel.

5. The hermetically sealed package of claim 2 in which the amalgam is a mixture of liquid gallium, powdered copper and powdered nickel.

6. The hermetically sealed package of claim 2 in which the amalgam is a mixture of by weight 65% liquid gallium, 30% powdered copper and 5% powdered nickel.

7. The hermetically sealed package of claim 2 further comprising a separate sealing pad on the surface of the housing around the recess and on the cover plate, and the amalgam is between the sealing pads and bonded thereto.

8. The hermetically sealed package of claim 7 in which the sealing pads are of the powdered metal in the amalgam.

9. The hermetically sealed package of claim 1 in which the housing is of a ceramic.

* * * * *